(12) United States Patent
Hageraats

(10) Patent No.: US 6,204,728 B1
(45) Date of Patent: Mar. 20, 2001

(54) RADIO FREQUENCY AMPLIFIER WITH REDUCED INTERMODULATION DISTORTION

(75) Inventor: Johannes J. E. M. Hageraats, Saratoga, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/239,445

(22) Filed: Jan. 28, 1999

(51) Int. Cl.$^7$ ........................................................ H03F 3/45
(52) U.S. Cl. .............................. 330/98; 330/311; 330/294
(58) Field of Search .............................. 330/98, 99, 100, 330/294, 311, 295

(56) References Cited

U.S. PATENT DOCUMENTS

| | | | |
|---|---|---|---|
| 3,371,283 | * 2/1968 | Rees | 330/311 |
| 4,406,990 | * 9/1983 | Noro | 330/311 |
| 4,511,857 | 4/1985 | Gunderson | 330/311 |
| 4,523,057 | 6/1985 | Boeckmann | 179/81 B |
| 4,706,038 | * 11/1987 | Navidi et al. | 330/271 |
| 5,015,968 | 5/1991 | Podell et al. | 330/277 |
| 5,157,345 | 10/1992 | Kenington et al. | 330/149 |
| 5,157,351 | 10/1992 | Carobolante | 330/277 |
| 5,276,406 | 1/1994 | Samay | 330/277 |
| 5,319,318 | 6/1994 | Kunihisa | 330/282 |
| 5,334,946 | 8/1994 | Kenington et al. | 330/144 |
| 5,426,641 | 6/1995 | Afrashteh et al. | 370/95.3 |
| 5,451,906 | 9/1995 | Kaltenecker . | |
| 5,481,389 | 1/1996 | Pidgeon et al. | 359/161 |
| 5,491,450 | 2/1996 | Helms et al. | 330/277 |
| 5,646,573 | 7/1997 | Bayruns et al. | 330/59 |
| 5,661,437 | 8/1997 | Nishikawa | 330/282 |
| 5,732,341 | 3/1998 | Wheatley | 455/234.1 |
| 5,945,880 | * 8/1999 | Souetinov | 330/311 |
| 6,054,880 | 4/2000 | Barou . | |

FOREIGN PATENT DOCUMENTS 2762727   10/1998   (FR) .

OTHER PUBLICATIONS

Hartopp et al., "Cascode Microphone pre–Amplifier", Wireless World, vol. 85, No. 1523, p. 92, Jul. 1979.
PCT International Search Report, Jun. 29, 2000, International Application No. PCT/US00/02393.

* cited by examiner

*Primary Examiner*—Michael B Shingleton
(74) *Attorney, Agent, or Firm*—Fish & Richardson P.C.

(57) ABSTRACT

Apparatus and methods of broadband amplification with high linearity and low power consumption are described. An apparatus configured to amplify a signal includes an input transistor and an output transistor coupled together in a cascode configuration with the input transistor defining an input of the amplifier and the output transistor defining an output of the amplifier. A feedback network is coupled between the input and the output and is characterized by an impedance of substantially zero resistance and non-zero reactance. A method of amplifying a signal is also described. An input signal is received at an input; the input signal is amplified to provide an output signal at an output; and the output signal is sampled at the input through a feedback network characterized by an impedance of substantially zero resistance and ion-zero reactance. A method of making an apparatus configured to amplify a signal is also described.

12 Claims, 5 Drawing Sheets

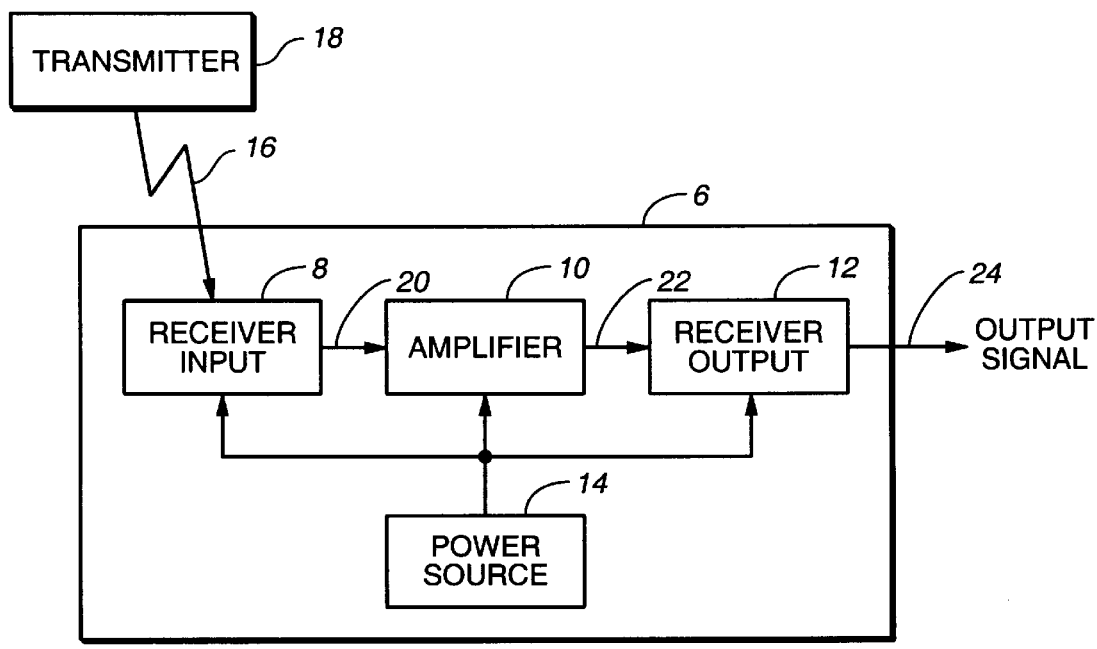
FIG._1
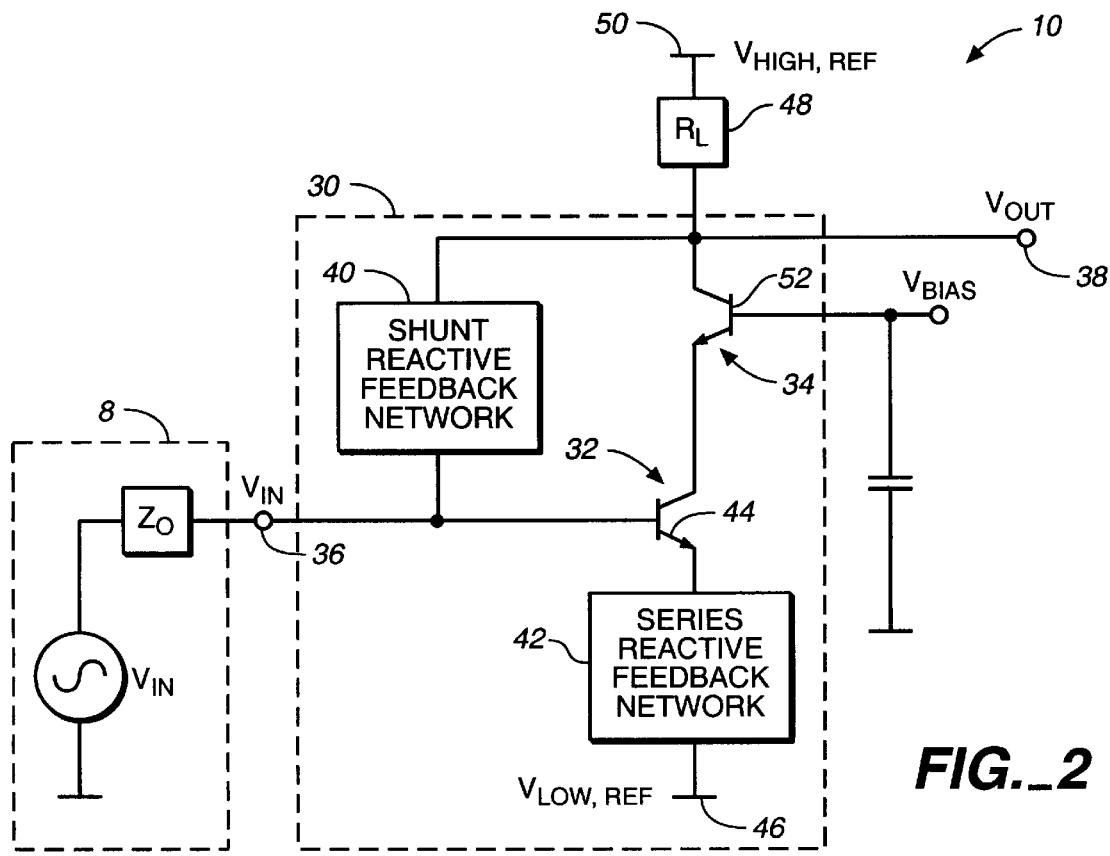
FIG._2

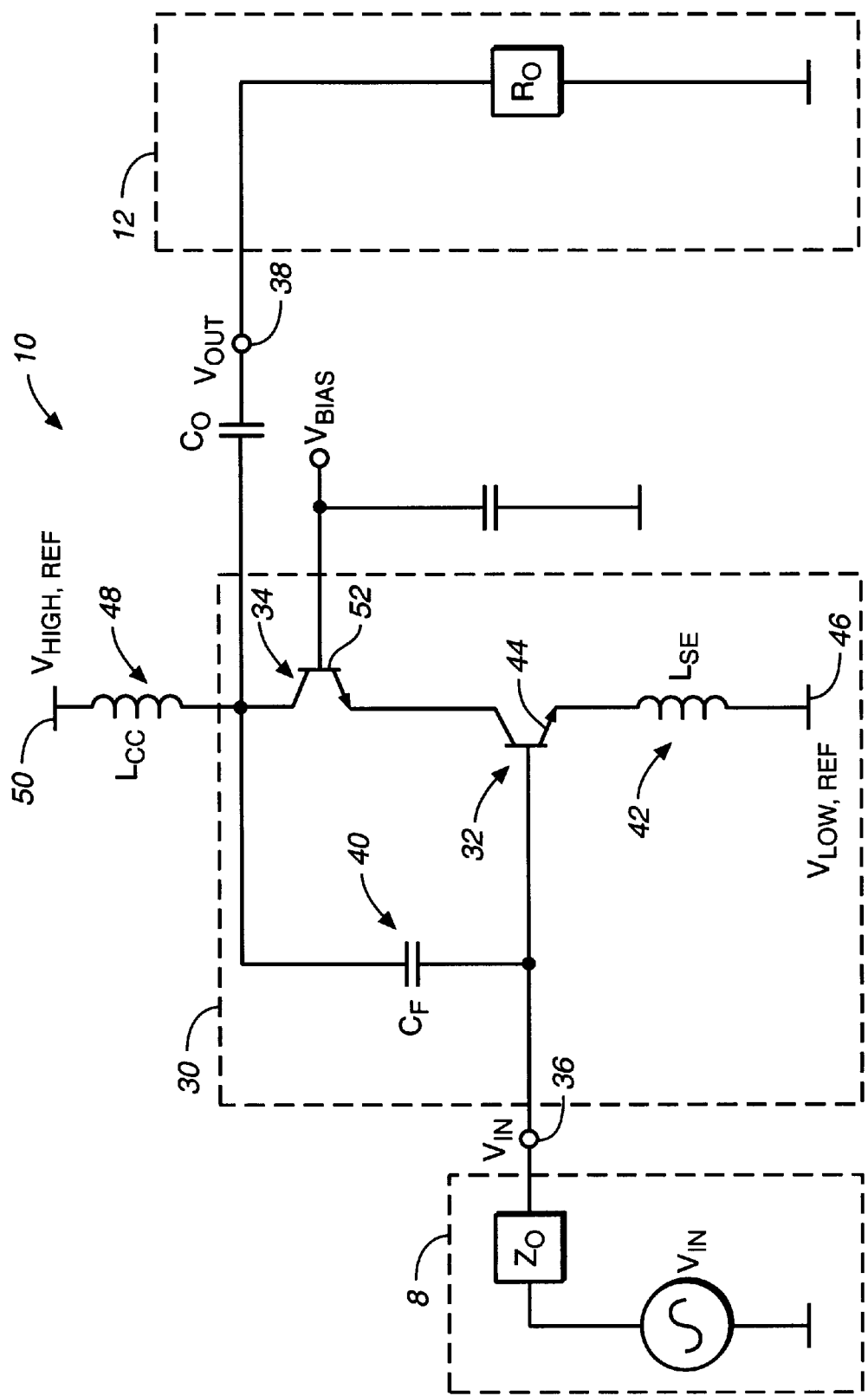
FIG._3

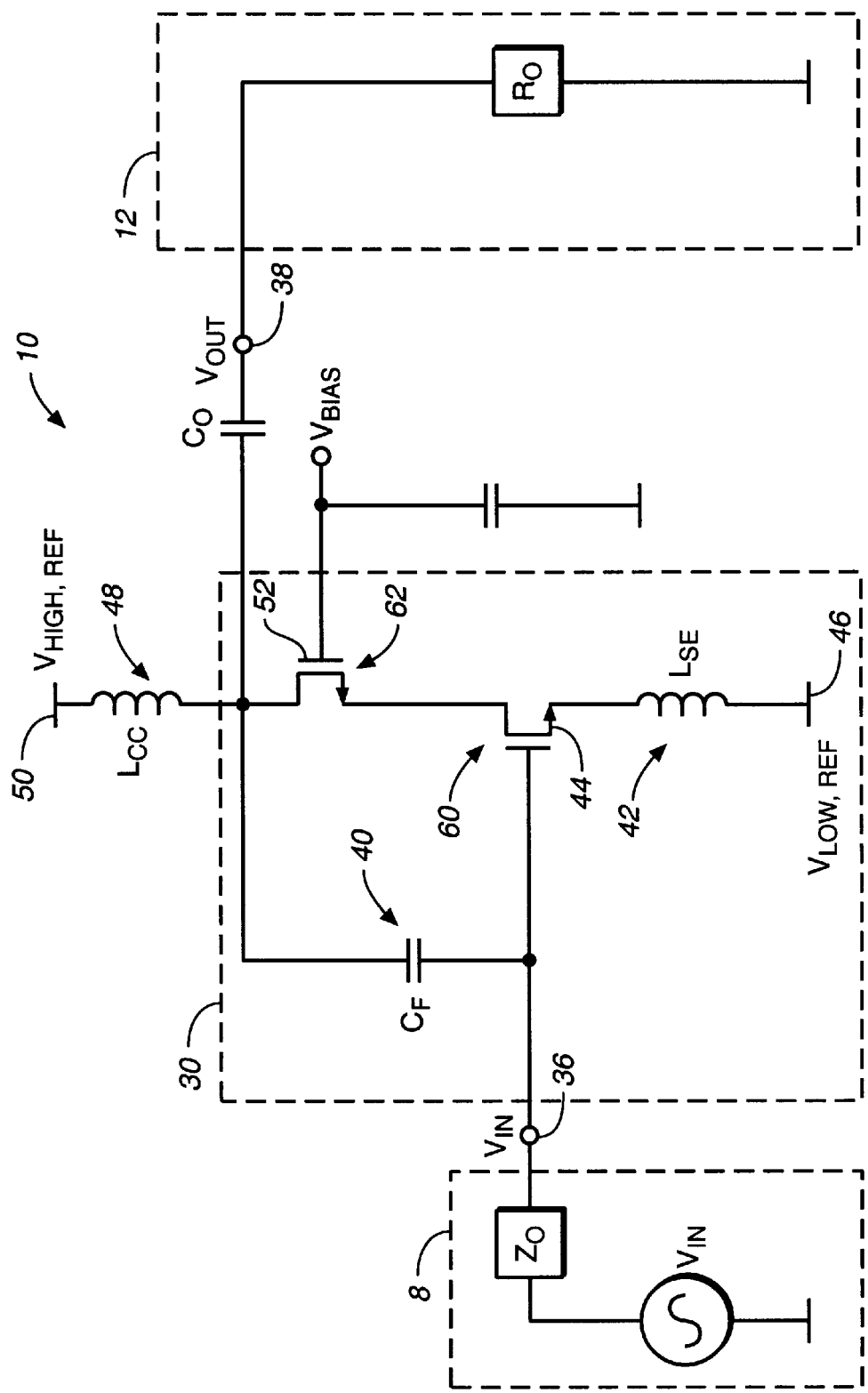
FIG._4A

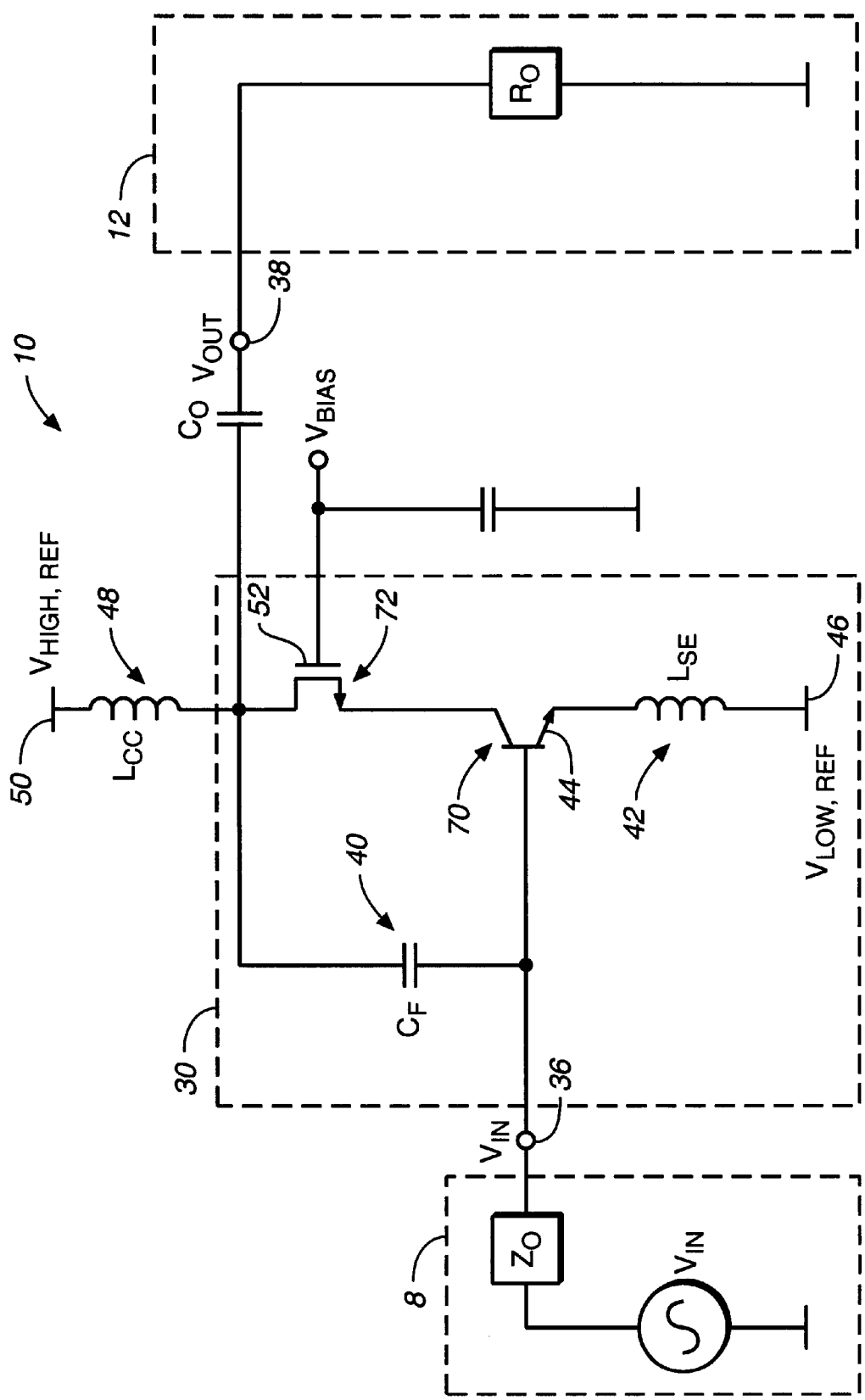
FIG._4B

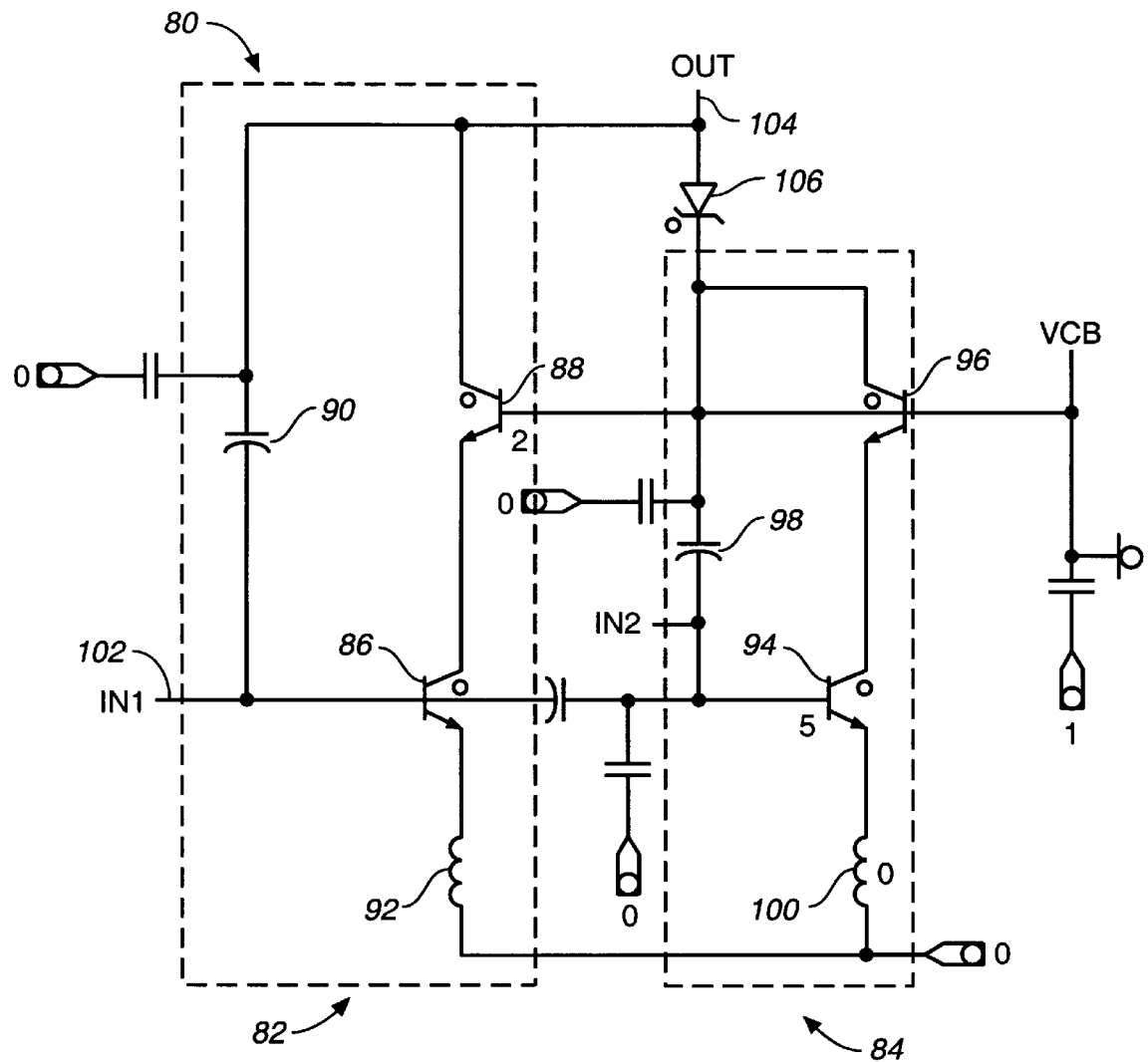
FIG._5

RADIO FREQUENCY AMPLIFIER WITH REDUCED INTERMODULATION DISTORTION

BACKGROUND OF THE INVENTION

This invention relates to apparatus and methods of broadband amplification with high linearity and low power consumption.

Broadband signal amplifiers and methods for amplifying signals over a wide range of frequencies have many applications. For example, wireless communication devices, such as cellular telephones, cordless telephones, pagers, television tuners, local area networks, and the like, require wide dynamic range, high linearity amplifiers to boost the strength of received signals without distortion and cross-talk between different frequencies. Unfortunately, all linear amplifiers distort the signals they are required to amplify to some degree. This is particularly undesirable when two or more independent channels are being amplified. Under these circumstances, the amplifier generates unwanted intermodulation products that may cause interference and result in poor performance of the communication device.

Intermodulation distortion is defined in terms of the peak spurious level generated by two or more tones injected into a receiver. A receiver may be characterized by a third-order distortion figure of merit referred to as a "third-order input intercept point" (IIP3), which is defined as the input power (in the form of two tones) required to create third-order distortion products equal to the input two tone power. The linearity of an amplifier, and thus the immunity of the receiver to distortion and cross-talk, improves with the IIP3 of the amplifier. Another amplifier figure of merit is equal to the ratio of the maximum microwave output power (at a specified level of distortion) to the applied DC power. The conventional method of specifying the level of distortion for this figure of merit is called the output intercept point of third order products (OIP3). In accordance with the OIP3 method, two input signals separated only slightly in frequency, and of substantially equal, but adjustable, power are applied to the amplifier input. A plot is made of both the fundamental frequency output power and the power in the third order intermodulation product versus the input power and a linear extrapolation is made of these two plots. The point where these two extrapolations intersect is the OIP3 amplitude, which is read in dB from the output power (ordinate) axis.

Amplifier linearity may be improved by increasing amplifier gain (see, e.g., Wheatley, U.S. Pat. No. 5,732,341). This approach, however, increases the power consumption of the amplifier and, thereby, decreases the length of time a user may operate battery-powered receivers incorporating such amplifiers before the batteries must be recharged.

SUMMARY OF THE INVENTION

In one aspect, the invention features an apparatus configured to amplify a signal, comprising: an input transistor and an output transistor coupled together in a cascode configuration with the input transistor defining an input of the apparatus and the output transistor defining an output of the apparatus; and a feedback network coupled between the input and the output and characterized by an impedance of substantially zero resistance and non-zero reactance.

Embodiments may include one or more of the following features.

The feedback network preferably has a reactance selected to reduce third-order intermodulation distortion produced at the output of the apparatus. The feedback network preferably comprises a feedback capacitor. The feedback network preferably consists essentially of capacitive reactance.

In a preferred embodiment, an inductive feedback network is coupled between the input transistor and a low voltage reference and consists essentially of inductive reactance. An inductor preferably is coupled between the input transistor and the low voltage reference. The inductive feedback network and the capacitive feedback network may have respective reactances selected to achieve a desired impedance at the input of the apparatus.

The reactance of the capacitive feedback network is selected to achieve an impedance at the input of the apparatus that is substantially independent of frequency over a broad frequency range. In one embodiment, the apparatus is configured to amplify a signal having a frequency of at least about 500 MHz with substantial linearity.

In some embodiments, a receiver input, configured to receive a wireless signal, is coupled to the apparatus input, and a receiver output, configured to produce an output signal representative of the wireless signal received at the receiver input, is coupled to the apparatus output.

In another aspect, the invention features a method of making an apparatus configured to amplify a signal, comprising: forming on a substrate an input transistor and an output transistor coupled together in a cascode configuration with the input transistor defining an input of the apparatus and the output transistor defining an output of the apparatus; and providing a feedback network coupled between the input and the output and characterized by an impedance of substantially zero resistance and non-zero reactance.

In yet another aspect, the invention features a method of amplifying a signal comprising: receiving an input signal at an input; amplifying the input signal to provide an output signal at an output; and sampling the output signal at the input through a feedback network characterized by an impedance of substantially zero resistance and non-zero reactance.

The output signal may be sampled at the input by coupling the output to the input through a feedback network that consists essentially of capacitive reactance. The method may further include the step of matching an output impedance by providing a series feedback network that consists essentially of inductive reactance.

In another aspect, the invention features an apparatus configured to amplify a signal, comprising: first and second amplification stages, each comprising an input transistor and an output transistor coupled together in a cascode configuration with the input transistor defining an input of the amplification stage and the output transistor defining an output of the amplification stage, a capacitive feedback network coupled between the input and the output and consisting essentially of capacitive reactance, and an inductive feedback network coupled between the input transistor and a low voltage reference and consisting essentially of inductive reactance; wherein the inputs of the amplification stages are coupled together to form an input of the apparatus, and the outputs of the amplification stages are coupled together by an isolator.

In one embodiment, the isolator comprises a diode.

Among the advantages of the invention are the following.

The invention reduces (or rejects) the intermodulation products inherently present in non-linear amplifier circuits. The OIP3 is improved by at least 3–6 dB at a given supply current; or, the same OIP3 may be obtained at a lower power dissipation (e.g., in one embodiment, a 50% current reduction may be achieved). The low power requirements of the invention makes it particularly useful for wireless applications. The inventive amplifiers and amplification methods described herein also achieve an input impedance and transfer characteristic that is flat over a broad frequency range (at least an octave). Furthermore, the lIP3 is easily adjusted, without changing other circuit parameters or specifications, by simply altering the supply current. Moreover, matching to a real input impedance is accomplished relatively easily. The invention is also substantially insensitive to fabrication process variations. The invention is applicable to a wide variety of applications, including various wireless circuits, without sacrificing important design parameters.

Other features and advantages will become apparent from the following description, including the drawings and the claims.

BRIEF DESCRIPTION OF THE DRAWINGS

FIG. 1 is a block diagram of a wireless receiver receiving a signal from a transmitter.

FIG. 2 is a circuit diagram of a low power, broadband amplifier with shunt and series reactive feedback networks.

FIG. 3 is a circuit diagram of a low power, broadband amplifier with a capacitive shunt feedback network and an inductive series feedback network implemented with bipolar transistors.

FIG. 4A is a circuit diagram of a low power, broadband amplifier with a capacitive shunt feedback network and an inductive series feedback network implemented with field effect transistors (FETs).

FIG. 4B is a circuit diagram of a low power, broadband amplifier with a capacitive shunt feedback network and an inductive series feedback network implemented with a FET and a bipolar transistor manufactured using a BICMOS process.

FIG. 5 is a circuit diagram of a switched gain amplifier formed from two low power, broadband amplifier stages each having a capacitive shunt feedback network and an inductive series feedback network.

DESCRIPTION OF THE PREFERRED EMBODIMENTS

Referring to FIG. 1, an apparatus 6 configured to amplify a signal (e.g., a portable wireless receiver, such as a cellular telephone) includes a receiver input 8, an amplifier 10, a receiver output 12, and a power source 14 (e.g., a battery). Receiver input 8 is configured to receive an electromagnetic signal 16 (e.g., a signal with a frequency that is greater than 100 MHZ, and may be greater than 500 MHZ) from a transmitter 18 and to produce an electrical signal 20. Amplifier 10 receives signal 20 and delivers an amplified signal 22 to receiver output 12, which converts amplified signal 22 into a suitable output signal 24 (e.g., sound representative of a human voice).

Although only a single electromagnetic signal 16 is shown in FIG. 1, other signals (at different frequencies) are typically received by receiver input 8. As explained above, when two or more tones are received by receiver input 8, amplified signal 22 will contain intermodulation products that may interfere with the desired input signal. The intermodulation products which have the greatest adverse impact on the quality of amplified signal 22 are those which correspond to a third-order component of the intermodulation distortion represented by IM3, which includes $2f_1-f_2$ and $f_1-2f_2$ frequency components where $f_1$-and $f_2$ are the frequencies of two tones simultaneously injected into wireless receiver 6. As explained below, amplifier 10 is configured to reduce IM3 intermodulation distortion and, thereby, provide an improved intermodulation characteristic, without sacrificing the noise factor (NF) of the amplifier and while enabling the amplifier input to be impedance-matched with receiver input 8 with relative ease. In the drawings described below, receiver input 8 is represented by a voltage source $V_{in}$ and an output impedance $Z_0$, and receiver output 12 is represented by a capacitor $C_0$ and a load impedance $R_0$. Other configurations are possible.

As shown in FIG. 2, amplifier 10 includes an amplification stage 30 that is formed from an input bipolar transistor 32 (e.g., a heterojunction bipolar transistor) and an output bipolar transistor 34 (e.g., a heterojunction bipolar transistor) coupled together in a cascode configuration with input transistor 32 defining an input 36 of amplifier 10 and output transistor 34 defining an output 38 of amplifier 10. A shunt reactive feedback network 40, which is characterized by an impedance of substantially zero resistance and non-zero reactance, is coupled between input 36 and output 38. Shunt feedback network 40 has a reactance selected to reduce the IM3 intermodulation distortion produced at output 38 of amplifier 10. A series reactive feedback network 42, which is characterized by an impedance of substantially zero resistance and non-zero reactance, is coupled between the emitter 44 of input transistor 32 and a low voltage reference 46. Series feedback network 42 improves the linearity of amplifier 10 and, together with shunt feedback network 40, defines the input impedance of amplifier 10. The reactances of shunt feedback network 40 and series feedback network 42 are selected to achieve an input impedance of amplifier 10 that matches the output impedance ($Z_0$) of receiver input 8. Because only reactive components are used in shunt feedback network 40 and series feedback network 42, the noise factor (NF) of amplification stage 30 may be optimized by conventional design techniques. A bias impedance 48 couples the collector of output transistor 34 to a high voltage reference 50 to provide DC bias to amplification stage 30. A biasing network (represented by $V_{Bias}$) biases the base 52 of output transistor 34.

Referring to FIG. 3, in one embodiment, shunt feedback network 40 consists of a feedback capacitor $C_F$ with a capacitance selected to reduce the IM3 intermodulation distortion produced at output 38 of amplifier 10. Series feedback network 42 consists of an inductor $L_{SE}$ with an inductance selected to improve the linearity of amplification stage 30. By using excessive inductive series feedback (e.g., $L_{SE}$ with a value of about 1–3 nH for an operating frequency of about 2 GHz), series feedback network 42 is linearized without altering the NF. The values of $C_F$ and $L_{SE}$ are also selected to match the output impedance of receiver 8 (e.g., $Z_0$ has a value of about 50 ohms). In operation, the shunt capacitive feedback $C_F$ reduces the real part of the input impedance and also offsets the negative imaginary part of the input impedance (in some cases offsetting the negative imaginary part of the input impedance completely). This enables the input impedance to be matched easily with the output impedance of receiver input 8. In addition, shunt feedback capacitor $C_F$ reduces (or rejects) the IM3 products because of the favorable phase of the IM3 products at amplifier output 38 with respect to amplifier input 36 and the fact that the AC current through $C_F$ is approximately equal to $V_{OUT}\cdot j\omega C_F$. Bias impedance 48 consists of an inductor $L_{cc}$.

The power gain ($S_{21}$) of amplification stage 30 may be approximated by:

$$S_{21} = j \cdot \frac{\left(\omega C_F R_L + \frac{R_L}{\omega L_{SE}}\right)}{1 + j\omega C_F R_L} \cdot \sqrt{\frac{Z_0}{R_L}}$$

This approximation has been confirmed by simulation.

In an embodiment that is optimized for operation at frequency of about 2 GHz, $C_F$ has a value of about 140 fF, $L_{SE}$ has a value of about 1.5 nH, bias impedance 48 ($R_L$) has an impedance of about 200 ohms, $C_O$ has a value of about 1 pF, $L_{cc}$ has a value of about 7 nH, and $Z_0$ has a value of about 50 ohms. These parameter values result in an amplifier gain of about 14.3 dB∠70° independent of the supply current or process used.

The embodiment of FIG. 3 may be manufactured using conventional semiconductor device fabrication techniques. For example, the entire amplifier circuit, including amplification stage 30, bias impedance 48, and biasing network ($V_{Bias}$) may be fabrication on a semiconductor substrate using conventional semiconductor deposition and ion implantation techniques, as well as conventional photolithography patterning techniques. Bipolar transistors 32, 34 may be formed using known bipolar and heterojunction bipolar technologies.

Other embodiments are within the scope of the claims.

For example, referring to FIG. 4A, in another embodiment, amplification stage 30 is formed from an input field effect transistor (FET) 60 and an output FET 62 coupled together in a cascode configuration. The other design components and the operation of this embodiment are similar to the corresponding components and operation of the embodiment described in connection with FIG. 3.

As shown in FIG. 4B, in yet another embodiment, amplification stage 30 may be formed from an input bipolar transistor 70 and an output FET 72 coupled together in a cascode configuration and fabricated using a BICMOS process. The other design components and the operation of this embodiment are similar to the corresponding components and operation of the embodiment described in connection with FIG. 3.

As shown in FIG. 5, a switched gain amplifier 80 may be formed from two amplification stages 82, 84 coupled together in parallel. Amplification stage 82 includes an input transistor 86 and an output transistor 88 coupled together in a cascode configuration, a shunt feedback capacitor 90, and a series feedback inductor 92. Amplification stage 84 includes an input transistor 94 and an output transistor 96 coupled together in a cascode configuration, a shunt feedback capacitor 98, and a series feedback inductor 100. The bases of input transistors 86, 94 are coupled together to form an input 102 of switched gain amplifier 80. The output of amplification stage 82 forms an output 104 of switched gain amplifier 80. The output of amplification stage 84 is coupled to output 104 through a diode 106, which isolates shunt feedback capacitor 98 when amplification stage 82 is turned on. Other techniques may be used to isolate shunt feedback capacitor 98. For example, diode 106 may be replaced by a CMOS switch; alternatively, diode 106 and feedback capacitors 90, 98 may be replaced by a varactor diode.

In operation, the gain of amplifier 80 may be changed by switching between amplification stage 82 and amplification stage 84. When amplification stage 82 is turned on, the input impedance is determined by shunt feedback capacitor 90 and series feedback inductor 92. When amplification stage 84 is turned on, the input impedance is determined by shunt feedback capacitor 90, shunt feedback capacitor 98, and series feedback inductor 100. Thus, by proper selection of the shunt feedback capacitors and the series feedback inductors, the input impedance of amplifier 80 may remain substantially constant. As in the embodiments described above, shunt feedback capacitors 90, 98 have capacitances selected to reduce IM3 intermodulation distortion produced at output 104 of amplifier 80.

Still other embodiments are within the scope of the claims.

What is claimed is:

1. An apparatus configured to amplify a signal, comprising:
    an input transistor and an output transistor coupled together in a cascode configuration, wherein the input transistor is configured to receive a radio frequency signal;
    a shunt capacitive feedback network coupled between the input transistor and the output transistor and characterized by an impedance of substantially zero resistance and non-zero reactance, wherein the reactance is selected to reduce third-order intermodulation distortion products at the output transistor; and
    a series inductive feedback network coupled between the emitter of the input transistor and a reference point.

2. The apparatus of claim 1, wherein the shunt capacitive feedback network comprises a feedback capacitor.

3. The apparatus of claim 1, wherein the shunt capacitive feedback network consists essentially of capacitive reactance.

4. The apparatus of claim 1, wherein the series inductive and shunt capacitive feedback networks have respective reactance's selected to achieve a desired impedance at the input of the apparatus.

5. The apparatus of claim 1, wherein the reactance of the combined series inductive and shunt capacitive feedback networks is selected to achieve an impedance at the input of the apparatus that is substantially independent of frequency over a broad frequency range.

6. The apparatus of claim 1, configured to amplify a signal having a frequency of at least about 500 MHZ with substantial linearity.

7. The apparatus of claim 1, further comprising a receiver input coupled to the apparatus input and configured to receive a wireless signal, and a receiver output coupled to the apparatus output and configured to produce an output signal representative of the wireless signal received at the receiver input.

8. A method of amplifying a signal, comprising:

receiving an input radio frequency signal at the base of an input transistor coupled to an output transistor in a cascode configuration, the input transistor having an emitter degeneratively coupled to a reference point through a series inductive circuit;

amplifying the input signal to provide an output signal at the collector of the output transistor; and rejecting third order intermodulation distortion products at the output transistor by feeding the output signal back to the input transistor through a shunt capacitive feedback network characterized by an impedance of substantially zero resistance and non-zero reactance.

9. The method of claim 8, wherein the output signal is fed back to the base of the input transistor by coupling the collector of the output transistor to the base of the input transistor through a feedback network that consists essentially of capacitive reactance.

10. The method of claim 8, further comprising selecting the reactances of the series inductive and shunt capacitive feedback circuits to match an output impedance.

11. An apparatus configured to amplify a signal, comprising: first and second amplification stages, wherein each amplification stage comprises an input transistor and an output transistor coupled together in a cascode configuration with the base of the input transistor defining an input of the amplification stage and the collector of the output transistor defining an output of the amplification stage, a shunt capacitive feedback network coupled between the input and the output and characterized by an impedance of substantially zero resistance and non-zero reactance the network configured to reject third order intermodulation distortion products and a series inductive feedback network coupled between the base of the input transistor and a reference point and consisting essentially of inductive reactance;

wherein the inputs of the amplification stages are coupled together to form an input of the apparatus, and the outputs of the amplification stages are coupled together by an isolator.

12. The apparatus of claim 11, wherein the isolator comprises a diode.

* * * * *